United States Patent
Yanase

(10) Patent No.: US 12,050,400 B2
(45) Date of Patent: Jul. 30, 2024

(54) PELLICLE FRAME, PELLICLE, AND METHOD FOR PEELING PELLICLE

(71) Applicant: Shin-Etsu Chemical Co., Ltd., Tokyo (JP)

(72) Inventor: Yu Yanase, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 18/370,197

(22) Filed: Sep. 19, 2023

(65) Prior Publication Data

US 2024/0004287 A1    Jan. 4, 2024

Related U.S. Application Data

(63) Continuation of application No. 17/948,884, filed on Sep. 20, 2022, now Pat. No. 11,796,908, which is a continuation of application No. 17/158,476, filed on Jan. 26, 2021, now Pat. No. 11,480,870, which is a continuation of application No. 16/127,605, filed on Sep. 11, 2018, now Pat. No. 10,935,882.

(30) Foreign Application Priority Data

Oct. 10, 2017   (JP) ................. 2017-196982

(51) Int. Cl.
G03F 1/64       (2012.01)
G03F 1/82       (2012.01)

(52) U.S. Cl.
CPC . *G03F 1/64* (2013.01); *G03F 1/82* (2013.01)

(58) Field of Classification Search
CPC ..................................... G03F 1/64; G03F 1/82
USPC ............................................................ 430/5
See application file for complete search history.

(56) References Cited

U.S. PATENT DOCUMENTS

| | | |
|---|---|---|
| 5,814,381 A | 9/1998 | Kuo |
| 6,303,196 B1 | 10/2001 | Funatsu |
| 10,435,882 B2 | 10/2019 | Maney et al. |
| 10,935,882 B2 | 3/2021 | Yanase |
| 11,480,870 B2 | 10/2022 | Yanase |
| 2002/0090558 A1 | 7/2002 | Shirasaki |
| 2005/0088637 A1 | 4/2005 | Laganza et al. |
| 2007/0190433 A1 | 8/2007 | Hirayanagi |
| 2008/0213679 A1 | 9/2008 | Miyakawa et al. |
| 2010/0190097 A1 | 7/2010 | Nagata |
| 2013/0089814 A1 | 4/2013 | Kim et al. |
| 2017/0184956 A1 | 6/2017 | Kohmura et al. |

FOREIGN PATENT DOCUMENTS

| | | |
|---|---|---|
| JP | 2000-292909 A | 10/2000 |
| JP | 2007-298870 A | 11/2007 |
| JP | 2008-83166 A | 4/2008 |
| JP | 2015-18228 A | 1/2015 |
| JP | 2017-83791 A | 5/2017 |
| TW | 200416481 A | 9/2004 |
| WO | WO 2007/094197 A1 | 8/2007 |
| WO | WO2008/105531 A1 | 9/2008 |
| WO | WO 2009/008294 A1 | 1/2009 |
| WO | WO 2016/043292 A1 | 3/2016 |

OTHER PUBLICATIONS

European Patent Office Communication and extended Search Report issued in European Patent Application No. 20153357.7 on Jul. 8, 2020.
Extended European Search Report for European Application No. 18196526.0, dated Feb. 26, 2019.
Japanese Notice of Reasons for Refusal (including an English translation thereof) issued in the corresponding Japanese Patent Application No. 2017-196982 on Oct. 6, 2020.
Japanese Office Action for corresponding Japanese Application No. 2021-016290, dated Jun. 14, 2022, with English translation.
Japanese Office Action, dated Jun. 8, 2021, for Japanese Application No. 2017-196982, with an English machine translation.

*Primary Examiner* — Christopher G Young
(74) *Attorney, Agent, or Firm* — Birch, Stewart, Kolasch & Birch, LLP

(57) ABSTRACT

The present invention is to provide a pellicle frame in a frame shape having an upper end face on which a pellicle film is to be arranged and a lower end face to face a photomask, which is characterized by being provided with a notched part from the outer side face toward inner side face of the lower end face; a pellicle including the pellicle frame as an element; and a method for peeling a pellicle from a photomask onto which the pellicle has been attached, which is characterized by inserting a peeling jig into a notched part from a side face of a pellicle frame, and moving the peeling jig in an upper end face direction of the pellicle frame in this state to peel off the pellicle from the photomask.

21 Claims, 7 Drawing Sheets

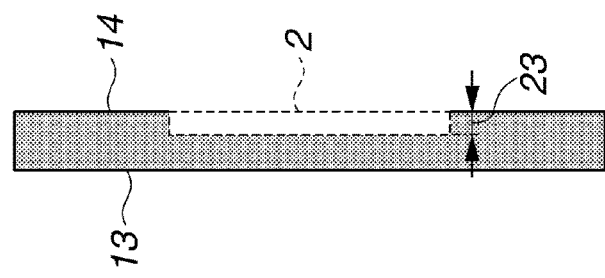
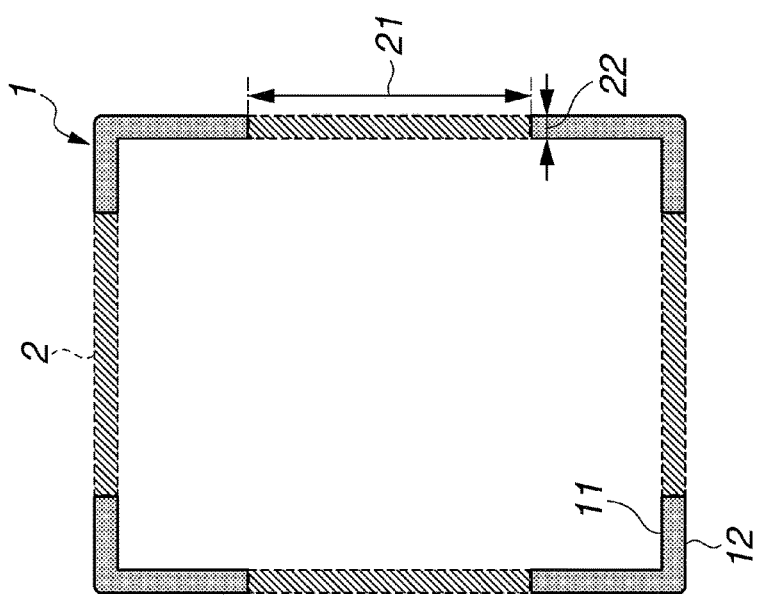
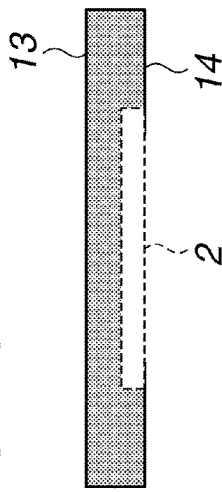

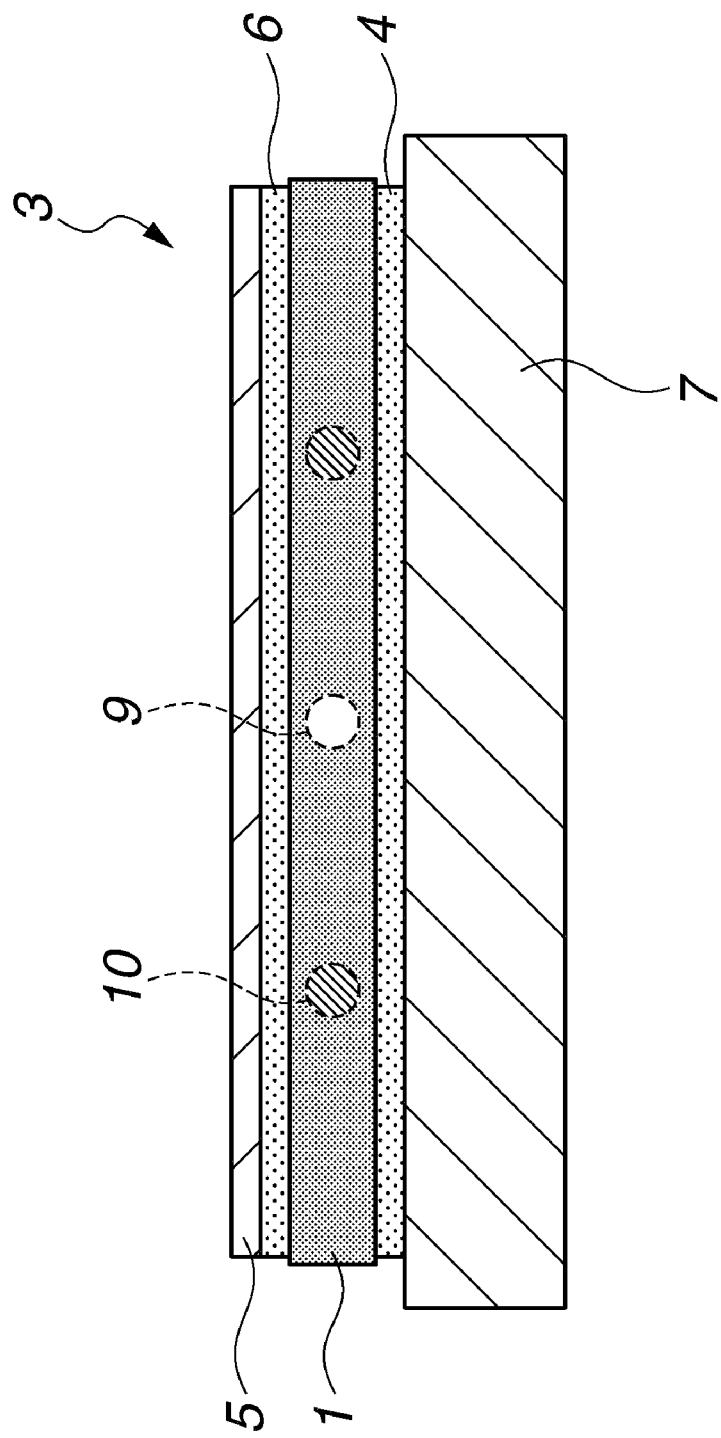

PELLICLE FRAME, PELLICLE, AND METHOD FOR PEELING PELLICLE

CROSS-REFERENCE TO RELATED APPLICATIONS

This application is a Continuation Application of application Ser. No. 17/948,884, filed on Sep. 20, 2022, which is a Continuation Application of application Ser. No. 17/158,476, filed on Jan. 26, 2021 (now U.S. Pat. No. 11,480,870, issued on Oct. 25, 2022), which is a Continuation Application of application Ser. No. 16/127,605, filed on Sep. 11, 2018 (now U.S. Pat. No. 10,935,882, issued on Mar. 2, 2021), which claims the benefit under 35 U.S.C. § 119(a) to Patent Application No. 2017-196982, filed in Japan on Oct. 10, 2017, all of which are hereby expressly incorporated by reference into the present application.

TECHNICAL FIELD

The present invention relates to a pellicle frame to be attached onto a photomask for lithography as a dust guard, a pellicle, and a method for peeling a pellicle.

BACKGROUND ART

In recent years, in a design rule of a large scale integration (LSI), miniaturization to sub-quarter micron has progressed, and along with the miniaturization, the wavelength of an exposure light source has been shortened. That is, the exposing light source has shifted from a g-line (436 nm) or i-line (365 nm) by a mercury lamp to a KrF excimer laser (248 nm), ArF excimer laser (193 nm) or the like, and further, extreme ultra violet (EUV) exposure using an EUV light having a main wavelength of 13.5 nm has been also studied.

In the semiconductor production of a LSI, a very large scale integration (VLSI) or the like, or in the production of a liquid crystal display board, a pattern is formed by irradiating a semiconductor wafer or an original plate for liquid crystal with light, however, if dust adheres to a photomask for lithography and a reticle (hereinafter, collectively referred to as an "exposure original plate"), which are to be used in this case, this dust absorbs light or bends light, so that there has been a problem that the transferred pattern is deformed or the edge becomes coarse, further the base becomes black and dirty, and the dimension, the quality, the appearance, or the like is impaired.

These works are usually performed in a clean room, however, it is still difficult to keep an exposure original plate clean. Accordingly, a method in which exposure is performed after attaching a pellicle as a dust guard onto a surface of an exposure original plate is generally adopted. In this case, foreign matters do not adhere directly onto a surface of an exposure original plate but adhere to a pellicle, therefore, if the focal point is set on a pattern of the exposure original plate at the time of lithography, the foreign matters on the pellicle become irrelevant to the transfer.

As to the basic constitution of the pellicle, a pellicle film having a high transmittance for the light to be used for exposure is stretched on an upper end face of a pellicle frame, and further an airtight gasket is formed on a lower end face of the pellicle frame. In general, a pressure-sensitive adhesive layer is used for the airtight gasket. The pellicle film is made of nitrocellulose, cellulose acetate, a fluorine-based polymer or the like, which well transmits the light (a g-line (436 nm) or i-line (365 nm) by a mercury lamp, a KrF excimer laser (248 nm), ArF excimer laser (193 nm) or the like) to be used for exposure, however, for EUV exposure, an ultrathin silicon film or a carbon film has been studied as a pellicle film.

Although a pellicle is used by being attached onto a photomask, in a case where a pellicle film becomes heavily dirty, in a case where a pellicle film is broken, or the like, it is required to peel the pellicle from the photomask. For this reason, a recess (jig hole) having a diameter of around 1 mm is provided on an outer side face of a pellicle frame in order to insert a peeling jig. For example, in the following Patent Document 1, a method in which a pin arranged in a peeling jig is inserted into a jig hole and peeling is performed by using this principle has been disclosed.

By the way, there are some restrictions on a pellicle frame for EUV exposure as a matter of convenience of an exposure device. Since the pellicle arrangement space in an EUV exposure device is small, the height of a pellicle is required to be 2.5 mm or less. In addition, since the pellicle may be exposed to a high temperature during EUV exposure, the pellicle frame for EUV is preferably made of a material having a linear expansion coefficient equal to or lower than that of the pellicle film for EUV.

The height of the pellicle for EUV is required to be 2.5 mm or less, therefore, the thickness of the pellicle frame is less than the 2.5 mm. In a case where a jig hole having a diameter of 1 mm is provided on an outer side face of such a pellicle frame, the thickness in the vicinity of the jig hole of the pellicle frame becomes thin. Therefore, there is a concern that the pellicle frame may be broken during processing of a jig hole or during peeling of a pellicle. In order to avoid the problem, it is conceivable to reduce the diameter of a jig hole, however, in that case, it is required to increase the number of jig holes in order to reliably perform the peeling. In this regard, the possibility of the breakage during processing is increased, and the yield is deteriorated after all. In particular, in a case where a brittle material such as a silicon crystal is used as a material for a pellicle frame, this problem becomes prominent.

CITATION LIST

Patent Document 1: JP-A 2007-298870

SUMMARY OF THE INVENTION

The present invention has been made in view of such circumstances, and an object of the present invention is to provide: a pellicle frame that is hardly broken during the processing of a jig hole formed in a pellicle frame or during the peeling of peeling a pellicle from a photomask; a pellicle using the pellicle frame; and further a method for peeling a pellicle.

The present inventors have found that in a pellicle frame in a frame shape, which has an upper end face on which a pellicle film is to be arranged and a lower end face to face a photomask, by providing a notched part from the outer side face toward inner side face of the lower end face, the risk of the breakage of a pellicle frame is reliably eliminated during the processing of a jig hole formed in the pellicle frame that has been conventionally used or during the peeling of a pellicle, and further, when a pellicle is peeled off from a photomask onto which the pellicle has been attached, the pellicle can be reliably peeled off by inserting a peeling jig into the notched part and moving the peeling jig in an upper end face direction of the pellicle frame; and thus have completed the present invention.

Therefore, the present invention provides the following pellicle frame, pellicle, and method for peeling a pellicle.

1. A pellicle frame in a frame shape, having an upper end face to arrange a pellicle film thereon and a lower end face to face a photomask, and a notched part being provided from an outer side face toward inner side face of the lower end face.
2. The pellicle frame according to 1, wherein the notched part is formed from the outer side face up to the inner side face.
3. The pellicle frame according to 1, wherein the pellicle frame has a thickness of less than 2.5 mm, and is made of a silicon crystal.
4. A pellicle, including: the pellicle frame according to 1 as an element.
5. The pellicle according to 4, wherein a mask pressure-sensitive adhesive layer is arranged on a part other than a notched part on a lower end face of the pellicle frame.
6. A method for peeling the pellicle according to 4 from a photomask, the pellicle being attached onto the photomask, the method including: inserting a peeling jig into a notched part from a side face of a pellicle frame; and moving the peeling jig in an upper end face direction of the pellicle frame in this state to peel off the pellicle from the photomask.
7. The method for peeling a pellicle according to 6, wherein an insertion part of the peeling jig has a flat plate shape corresponding to the notched part.

Advantageous Effects of the Invention

According to the present invention, a pellicle frame that is hardly broken during the processing of the pellicle frame or during the peeling of a pellicle, and a pellicle using the pellicle frame can be provided. In addition, in the present invention, a pellicle can be reliably peeled off from a photomask without causing any problem of breakage or the like.

BRIEF DESCRIPTION OF THE DRAWINGS

FIGS. 1A to 1C are schematic views showing one embodiment (Example 1) of a pellicle frame according to the present invention, FIG. 1A is a view as viewed from a lower end face side, FIG. 1B is a view as viewed from an outer face side of the long side, and FIG. 1C is a view as viewed from an outer face side of the short side;

FIG. 2A is a view as viewed from a lower end face side, FIG. 2B is a view as viewed from an outer face side of the long side, and FIG. 2C is a view as viewed from an outer face side of the short side;

FIG. 3A is a view as viewed from a lower end face side, FIG. 3B is a view as viewed from an outer face side of the long side, and FIG. 3C is a view as viewed from an outer face side of the short side;

FIG. 7 is a schematic side view when a conventional pellicle is attached onto a photomask.

DESCRIPTION OF THE PREFERRED EMBODIMENT

Figure 2B:
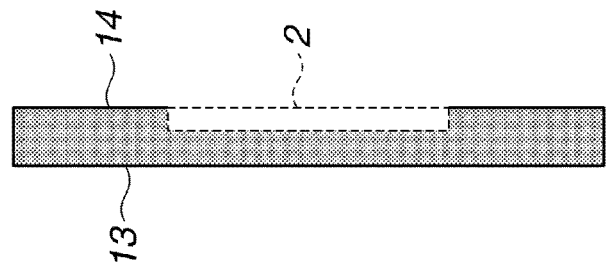
FIGS. 2A to 2C are schematic views showing another embodiment of the pellicle frame according to the present invention.
Figure 2A:
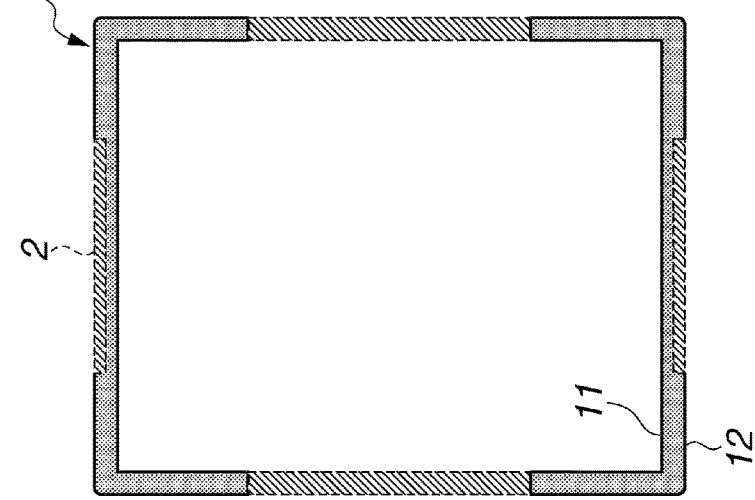
Figure 2C:
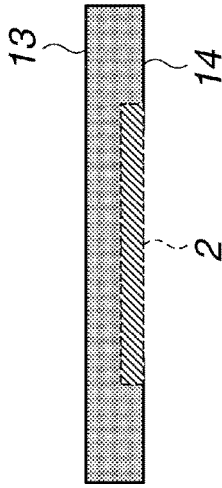
Figure 3B:
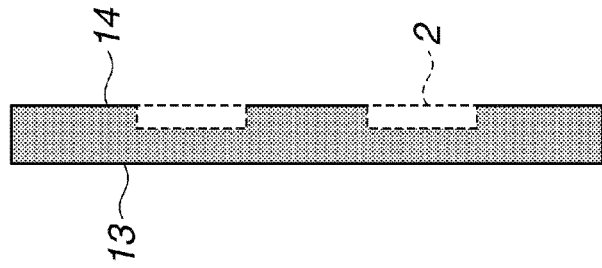
FIGS. 3A to 3C are schematic views showing another one embodiment (Example 2) of the pellicle frame according to the present invention.
Figure 3A:
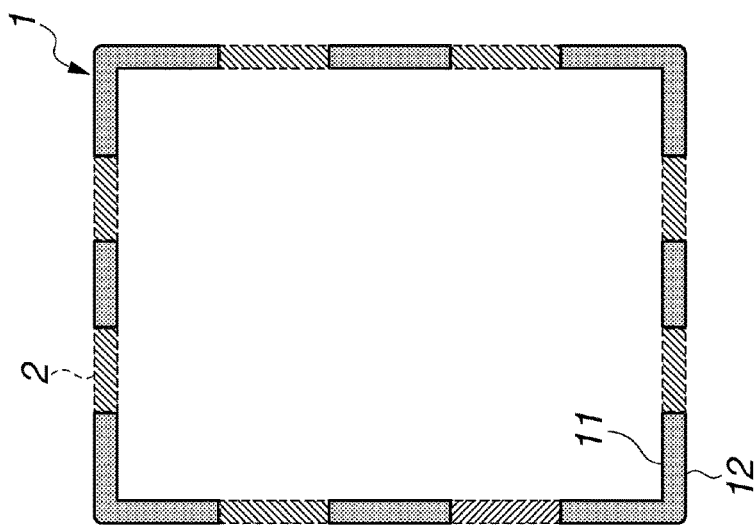
Figure 3C:
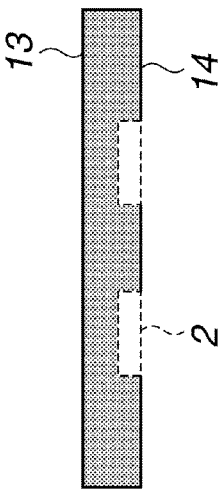
Figure 4:
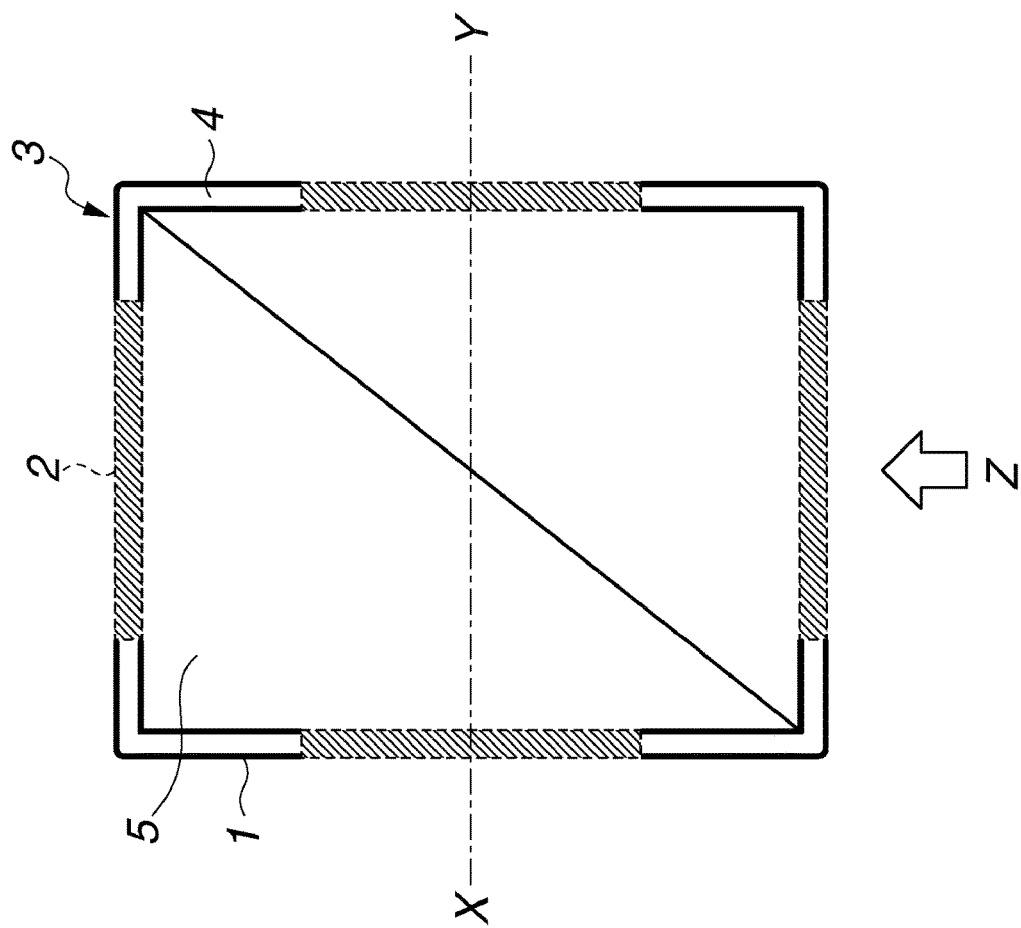
FIG. 4 is a schematic view as viewed from a lower end face side of a pellicle with the pellicle frame of FIGS. 1A to 1C to which a pressure-sensitive adhesive layer and a pellicle film are arranged.

The pellicle frame according to the present invention is a pellicle frame in a frame shape, which has an upper end face on which a pellicle film is to be arranged and a lower end face to face a photomask.

As long as the pellicle frame has a frame shape, the shape corresponds to the shape of a photomask onto which a pellicle is to be attached. In general, the shape of a pellicle frame is a quadrilateral (rectangular or square) frame shape.

In addition, in a pellicle frame, there are a face on which a pellicle film is to be arranged (herein, referred to as an upper end face) and a face to face a photomask (herein, referred to as a lower end face) when the pellicle frame is attached onto the photomask.

In general, on the upper end face, a pellicle film is arranged with an adhesive agent or the like therebetween, and on the lower end face, a pressure-sensitive adhesive or the like for attaching a pellicle onto a photomask is provided, but cases of the present invention are not limited to the above.

The material for a pellicle frame is not limited, and a known material can be used. In a pellicle frame for EUV, since there is a possibility of being exposed to a high temperature, a material having a small thermal expansion coefficient is preferred. For example, Si, $SiO_2$, SiN, quartz, invar, titanium, a titanium alloy, or the like can be mentioned. As a pellicle film for EUV, an ultrathin silicon film is expected to be promising, and a silicon crystal which is the same material as that for a pellicle film is preferred. The silicon crystal may be either a single crystal or a polycrystal, and a silicon single crystal that is easy to obtain and is inexpensive is preferred.

The size of a pellicle frame is not particularly limited, however, since the height of a pellicle for EUV is limited to 2.5 mm or less, the thickness of a pellicle frame for EUV is smaller than the height and is less than 2.5 mm.

For example, in a case of forming a hole in a pellicle frame made of a silicon crystal, a margin of at least 0.5 mm is required around the hole. Therefore, in a case of forming a hole having a diameter of 1 mm, the thickness is required to be at least 2.0 mm. That is, the present invention is particularly useful for a pellicle frame that has a thickness of less than 2.0 mm and is made of a silicon crystal.

In addition, the thickness of a pellicle frame for EUV is preferably 2.0 mm or less, and more preferably 1.6 mm or less in consideration of the thickness of a pellicle film, a mask pressure-sensitive adhesive and the like.

Further, in order to sufficiently exhibit a function as a pellicle, it is required to have a height of 1.5 mm or more. In this regard, the thickness of a pellicle frame for EUV is preferably 1.0 mm or more in consideration of the thickness of a pellicle film, a mask pressure-sensitive adhesive and the like.

In the pellicle frame according to the present invention, a notched part is provided from the outer side face toward inner side face of the lower end face. There are no restrictions on the location of the notched part and on the number of the notched parts, however, since the pellicle frame is used for holding a pellicle, it is preferred that the notched part is provided by one in each of two opposing sides at the minimum, that is, two or more notched parts in total are provided.

In addition, there are no restrictions also on the shape and size of the notched part, however, if the height of the notched part is increased, the thickness of the pellicle frame on an upper side of the notched part is correspondingly reduced, and there is a possibility of breakage. Therefore, the height of the notched part is preferably 50% or less of the thickness of the pellicle frame, more preferably 30% or less, and furthermore preferably 15% or less.

In a case of a pellicle frame made of a silicon crystal, it is preferred that the thickness of the pellicle frame on an upper side of the notched part is set to be 0.7 mm or more.

The notched part may be formed up to the middle of the pellicle frame, or may be formed so as to communicate from an outer side face up to an inner side face. If the notched part is formed from an outer side face up to an inner side face, the notched part can be used also as a ventilation part.

In general, in a pellicle frame, a ventilation part for reducing the pressure difference between the inside and outside of the pellicle is arranged. In particular, in EUV lithography, in order to make the inside of an exposure device vacuum, a pellicle for EUV is required to withstand the pressure changes from the atmospheric pressure to the vacuum, and a pellicle frame for EUV is required to have a ventilation part with a large area.

Conventionally, similarly as in the case of a jig hole, the ventilation part is provided as a through hole on a side face of the pellicle frame. Therefore, there is a concern that the ventilation part may be broken during processing as in the case of a jig hole. In particular, in a pellicle frame for EUV, a ventilation part with a large area is required, however, if the diameter of the through hole is set to be larger in order to make the ventilation part larger, the possibility of breakage is further increased. In addition, if the number of the through holes is also set to be larger, the possibility of breakage is increased similarly.

However, as long as the processing is for providing a notched part as in the present invention, even at a place where a pellicle frame is thin, the place has a certain thickness, therefore, the processing can be easily performed, and the possibility of breakage during processing can be lowered.

Further, when a peeling jig is inserted into a notched part to peeled off a pellicle, since a place (to come into contact with a peeling jig when the peeling jig is moved in an upper end face direction of a pellicle frame), where force is most applied, has a thickness of larger than that in the case of providing a hole in the vicinity of the center of a side face, the breakage during peeling is also hardly generated.

In addition, in a case where a notched part is used as a ventilation part, even if the height of the notched part is made smaller, so that the thickness of the pellicle frame is increased, by increasing the width, a large amount of ventilation can be realized.

In a case where a notched part is used as a ventilation part, the size of the part and the number of the parts are adjusted depending on the pressure change speed during the use of a pellicle. In a case of a pellicle frame for EUV, the total area of the opening parts is preferably at least 5 mm$^2$ or more, and more preferably 10 mm$^2$ or more. In addition, in the conventional excimer laser exposure, even if the total area was 1 mm$^2$ or less, it was sufficient.

For example, in a pellicle frame, both forms of a notched part formed up to the middle of the pellicle frame, and a notched part formed from an outer side face up to an inner side face may be provided. In this regard, for example, the notched part formed up to the middle of the pellicle frame is used for peeling, and the notched part formed from an outer side face up to an inner side face is used for ventilation, the application may be separated as such.

Further, multiple notched parts to be provided in a pellicle frame may have different shapes and sizes. For example, as described above, in a case where the application of notched parts is separated, the optimal shape and size can be selected depending on the application.

In addition, a filter may be arranged in a notched part formed from an outer side face up to an inner side face. In a case where the notched part is used for peeling, it is preferred to arrange a filter on an inner side face of the pellicle frame so as to cover the notched part, or to arrange a filter inside the notched part. In a case where the notched part is used only for ventilation, a filter may be arranged on an outer side face of the pellicle frame so as to cover the notched part.

In a case where a pressure-sensitive adhesive or the like is formed on a lower end face of a pellicle frame, it is preferred to adjust the filter size to the thickness of the pressure-sensitive adhesive.

The notched part can be used not only for peeling and ventilation but also as a jig hole during handling. Since a larger force is not applied to the jig hole for handling as compared with the force applied to a jig hole for peeling, the jig hole for handling may be provided as usual in the vicinity of the center of an outer side face of the pellicle frame. Further, as needed, other processing may be performed on an outer side face or an inner side face within the range of not being broken during processing.

In the pellicle according to the present invention, a pellicle film is arranged on an upper end face of the pellicle frame having the above constitution with a pressure-sensitive adhesive or an adhesive agent therebetween. The material for the pressure-sensitive adhesive or the adhesive agent is not limited, and a known material can be used. In general, the pressure-sensitive adhesive or the adhesive agent is formed so as to have a width equal to or smaller than the width of the pellicle frame over the entire circumferential direction of an end face of the pellicle frame.

In addition, there is no restriction on a material for a pellicle film, and as the material, a material having a high transmittance at a wavelength of an exposure light source and a high light resistance is preferred. For example, an ultrathin silicon film, a carbon film, or the like is used for EUV exposure.

Further, on a lower end face of a pellicle frame, a pressure-sensitive adhesive for the attachment onto a photomask is formed. The pressure-sensitive adhesive is preferably arranged on a part other than the notched part on a lower end face of the pellicle frame.

As the above-described pressure-sensitive adhesive, a known pressure-sensitive adhesive can be used, and an acrylic pressure-sensitive adhesive or a silicone-based pressure-sensitive adhesive can be suitably used. A silicone-based pressure-sensitive adhesive is preferred from the viewpoint of the heat resistance. The pressure-sensitive adhesive may be processed into an arbitrary shape as needed.

On a lower end face of the pressure-sensitive adhesive, a release layer (separator) for protecting the pressure-sensitive adhesive may be attached. There is no particular restriction on a material for the release layer, and for example, polyethylene terephthalate (PET), polytetrafluoroethylene (PTFE), tetrafluoroethylene-perfluoroalkyl vinyl ether copolymer (PFA), polyethylene (PE), polycarbonate (PC), polyvinyl chloride (PVC), polypropylene (PP), or the like can be used. Further, as needed, a release agent such as a silicone-based release agent or a fluorine-based release agent may be applied onto a surface of the release layer.

In the present invention, by inserting a peeling jig into a notched part from a side face of a pellicle frame, and moving the peeling jig in an upper end face direction of the pellicle frame in this state, a pellicle is peeled off from a photomask onto which the pellicle has been attached.

At this time, when the peeling jig is moved in an upper end face direction of the pellicle frame, the peeling jig preferably has a flat plate shape if the place to come into contact with the peeling jig of the pellicle frame is flat. The peeling jig preferably has a shape corresponding to the shape of a place to come into contact with the peeling jig of the pellicle frame. In this way, the contact area between the peeling jig and the upper side of the notched part is increased, so that the breakage of the pellicle frame is hardly generated.

Figure 5:
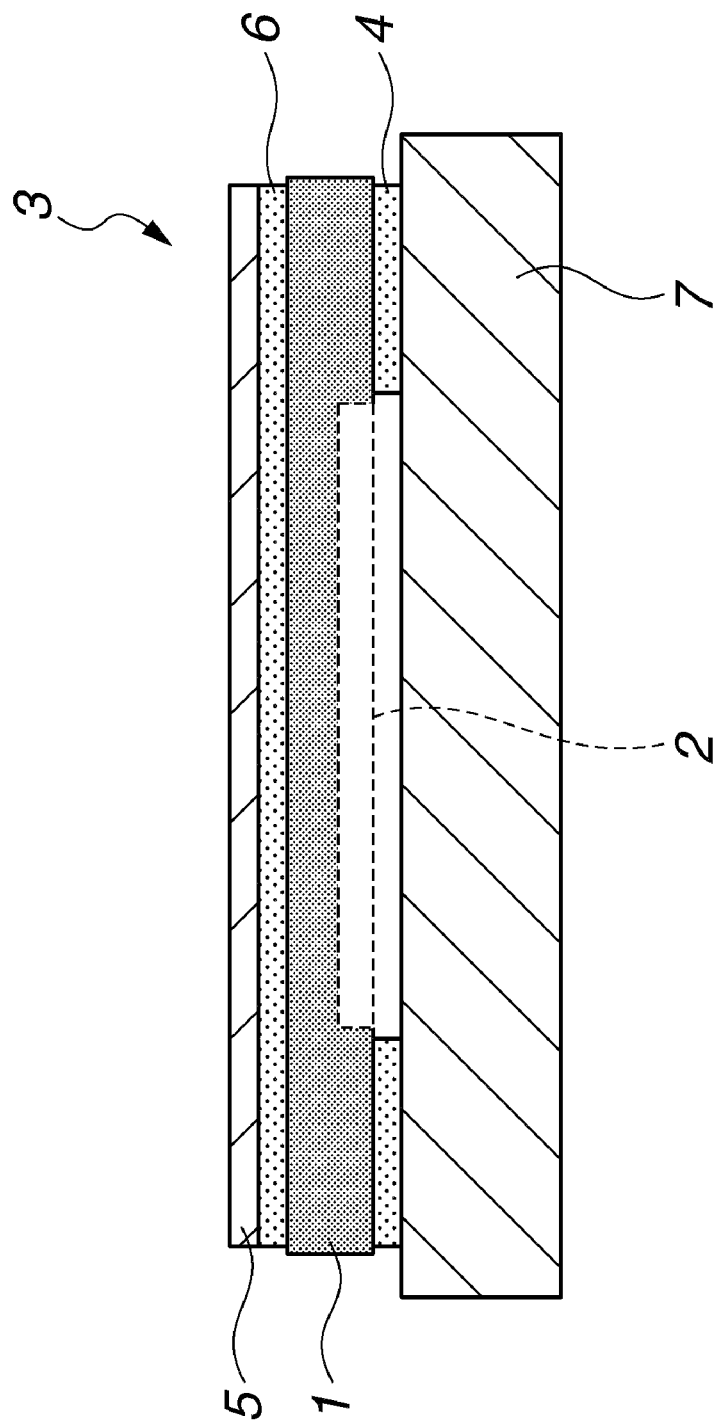
FIG. 5 is a schematic view of one in which the pellicle of FIG. 4 is attached onto a photomask, as viewed from a Z side of FIG. 4.
Figure 6:
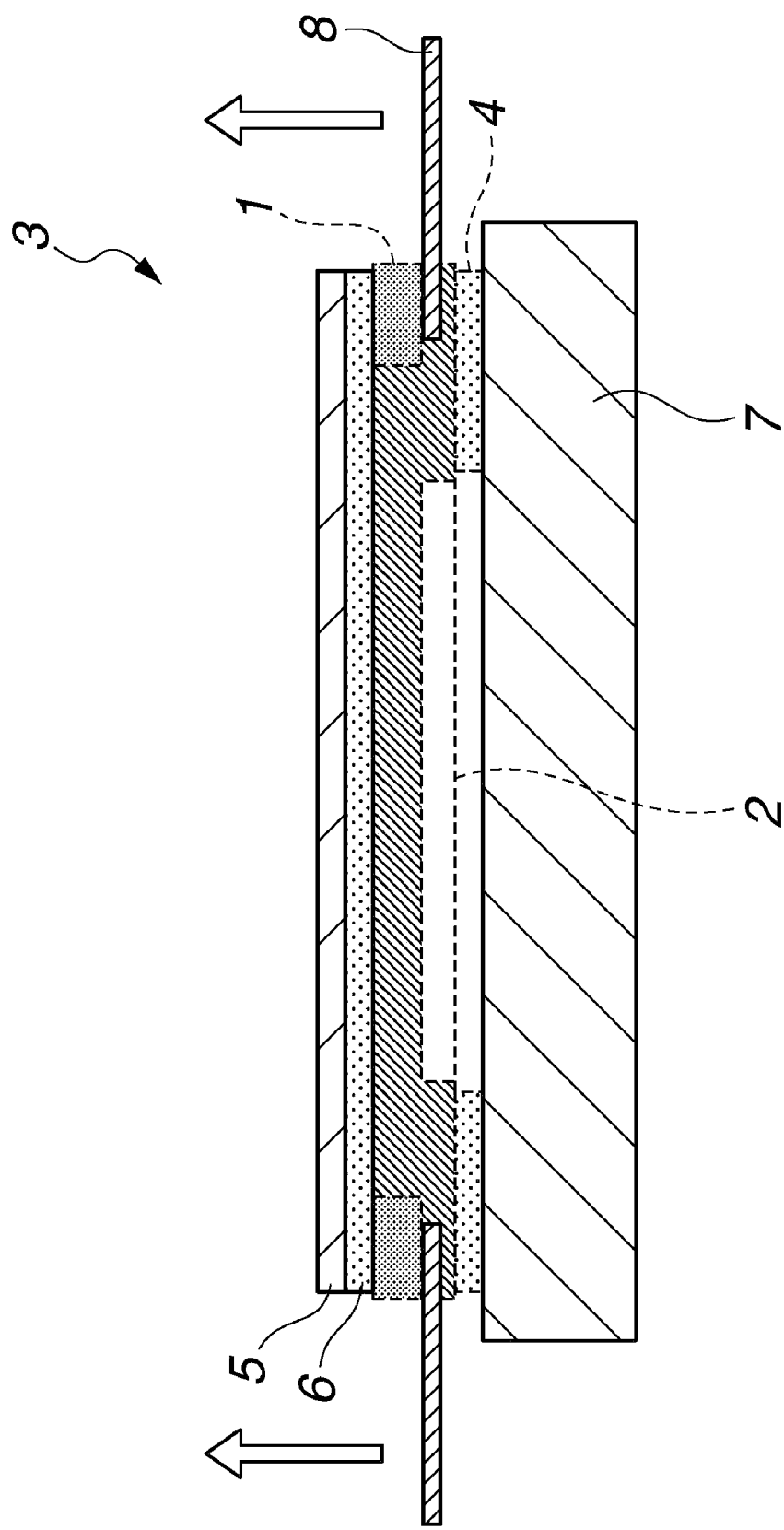
FIG. 6 is a schematic view (including a state when a pellicle is peeled from a photomask) of a X-Y cross section of FIG. 4.

Herein, FIGS. 1A to 1C, 2A to 2C, and 3A to 3C show an example of a pellicle frame 1 according to the present invention, and in each drawing, the reference sign 11 shows an inner side face of the pellicle frame, the reference sign 12 shows an outer side face of the pellicle frame, the reference sign 13 shows an upper end face of the pellicle frame, and the reference sign 14 shows a lower end face of the pellicle frame. The above-described pellicle frame 1 is provided with a notched part 2, and the reference sign 21 shows a width of the notched part, the reference sign 22 shows a depth of the notched part, and the reference sign 23 shows a height of the notched part. In addition, in FIGS. 2A to 2C, the notched part on the long side is formed from an outer side face to an inner side face, the notched part on the short side is formed up to the middle of the pellicle frame, and the notched part on the short side has a height larger than the height of the notched part on the long side so that a peeling jig can be easily inserted. Further, FIG. 5 shows a pellicle 3, and a pellicle film 5 is bonded and stretched onto an upper end face of the pellicle frame 1 by an adhesive agent 6. Furthermore, the pellicle 3 is peelably bonded to a photomask 7 by a pressure-sensitive adhesive 4 to protect a pattern surface on the photomask 7. Moreover, FIG. 6 shows a state in which a peeling jig 8 is inserted through the notched part 2 of the pellicle frame 1 when peeling off the pellicle from the photomask.

EXAMPLES

Hereinafter, the present invention is specifically described with reference to Examples and Comparative Examples, however, the present invention is not limited to the following Examples.

Example 1

A pellicle frame (with an outer size of 150 mm×118 mm×1.5 mm, and a frame width of 4 mm) made of a Si single crystal was prepared.

As shown in Example 1, a notched part with a width of 70 mm, a height of 0.2 mm, and a depth of 4 mm was provided on a lower end face at the center of each side of the pellicle frame. The notched part was formed from an outer side face up to an inner side face. In addition, the thickness on the upper side of the notched part was 1.3 mm, and the processing was performed without breakage.

The pellicle frame was cleaned, and a silicone pressure-sensitive adhesive (X-40-3264 manufactured by Shin-Etsu Chemical Co., Ltd.) was applied over the entire circumference of an upper end face of the frame. Further, a silicone-based pressure-sensitive adhesive (X-40-3264 manufactured by Shin-Etsu Chemical Co., Ltd.) was applied as a mask pressure-sensitive adhesive also on a part other than the notched part on a lower end face of the frame.

After that, the pellicle frame was heated at 90° C. for 12 hours to cure the pressure-sensitive adhesive on the upper and lower end faces. Subsequently, an ultrathin silicon film as a pellicle film was press bonded to the pressure-sensitive adhesive formed on the upper end face of the frame, and a pellicle was completed.

The pellicle was attached onto a quartz mask with a size of 150 mm×150 mm as a substitute for a photomask, and then a flat plate-shaped part of a peeling jig was inserted into the notched part, and by moving the peeling jig in an upper end face direction of the pellicle frame at a speed of 0.1 mm/s, the pellicle was peeled off from the photomask. Even when the pellicle was peeled off, the pellicle frame was not broken.

Example 2

A pellicle frame (with an outer size of 150 mm×118 mm×1.5 mm, and a frame width of 4 mm) made of a Si single crystal was prepared.

As shown in Example 2, on a lower end face of the long side of the pellicle frame, two notched parts each with a width of 30 mm, a height of 0.2 mm and a depth of 4 mm were provided at two places with a space of 30 mm. On a lower end face of the short side, two notched parts each with a width of 20 mm, a height of 0.2 mm and a depth of 4 mm were provided at two places with a space of 20 mm. The notched part is formed from an outer side face up to an inner side face. In addition, the thickness on the upper side of the notched part was 1.3 mm, and the processing was performed without breakage.

The pellicle frame was cleaned, and a silicone-based pressure-sensitive adhesive (X-40-3264 manufactured by Shin-Etsu Chemical Co., Ltd.) was applied over the entire circumference of an upper end face of the frame. In addition, an acrylic pressure-sensitive adhesive (SK-DYNE 1495 manufactured by Soken Chemical & Engineering Co., Ltd.) was applied as a mask pressure-sensitive adhesive also on a part other than the notched part on a lower end face of the frame.

After that, the pellicle frame was heated at 90° C. for 12 hours to cure the pressure-sensitive adhesive on the upper and lower end faces. Subsequently, an ultrathin silicon film as a pellicle film was press bonded to the pressure-sensitive adhesive formed on the upper end face of the frame, and a pellicle was completed.

The pellicle was attached onto a quartz mask with a size of 150 mm×150 mm as a substitute for a photomask, and then a flat plate-shaped part of a peeling jig was inserted into the notched part, and by moving the peeling jig in an upper end face direction of the pellicle frame at a speed of 0.1 mm/s, the pellicle was peeled off from the photomask. Even when the pellicle was peeled off, the pellicle frame was not broken.

Comparative Example 1

A pellicle frame (with an outer size of 150 mm×118 mm×1.5 mm, and a frame width of 4 mm) made of a Si single crystal was prepared.

On an outer side face of the long side of the pellicle frame, two jig holes each having a diameter of 1 mm and a depth of 1 mm were tried to be provided at two places each with a distance of 45 mm away from the center of the side in the corner direction, however, breakage occurred during the processing.

Comparative Example 2

A pellicle frame (with an outer size of 150 mm×118 mm×1.5 mm, and a frame width of 4 mm) made of a Si single crystal was prepared.

On an outer side face of the long side of the pellicle frame, two jig holes each having a diameter of 0.5 mm and a depth of 1 mm were provided at two places each with a distance of 45 mm away from the center of the side in the corner direction. The thickness on the upper side of the jig hole was 0.5 mm, and the processing was performed without breakage.

The pellicle frame was cleaned, and a silicone pressure-sensitive adhesive (X-40-3264 manufactured by Shin-Etsu Chemical Co., Ltd.) was applied over the entire circumference of an upper end face of the frame. In addition, a silicone pressure-sensitive adhesive (X-40-3264 manufactured by Shin-Etsu Chemical Co., Ltd.) was applied as a mask pressure-sensitive adhesive also on a part other than the notched part on a lower end face of the frame.

After that, the pellicle frame was heated at 90° C. for 12 hours to cure the pressure-sensitive adhesive on the upper and lower end faces. Subsequently, an ultrathin silicon film as a pellicle film was press bonded to the pressure-sensitive adhesive formed on the upper end face of the frame, and a pellicle was completed.

The pellicle was attached onto a quartz mask with a size of 150 mm×150 mm as a substitute for a photomask, and then a cylindrical-shaped part of a peeling jig was inserted into the jig hole, and the pellicle was tried to be peeled off from the photomask by moving the peeling jig in an upper end face direction of the pellicle frame at a speed of 0.1 mm/s. However, a peripheral part of the jig hole was broken, and the pellicle was not able to be peeled off.

Japanese Patent Application No. 2017-196982 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pellicle frame having two end faces and two side faces in a frame shape, having a plurality of recessed portions provided so that the recessed portions extend from one of said two end faces toward another of said two end faces, wherein the plurality of recessed portions include one recessed portion which extends from one of said two side faces toward another of said two side faces and does not penetrate from said one of the two side faces to said another of the two side faces, and another recessed portion which extends from one of said two side faces to another of said two side faces so that said another recessed portion penetrates from said one of the two side faces to said another of the two side faces, and
wherein the thickness of the pellicle frame is less than 2.5 mm.

2. The pellicle frame of claim 1, wherein the thickness of the pellicle frame is from 1.0 to 1.6 mm.

3. The pellicle frame of claim 1, wherein the recessed portion is an element of a ventilation portion.

4. The pellicle frame of claim 3 wherein the ventilation portion has opening parts and the total area of the opening parts is an area applicable to EUV lithography.

5. The pellicle frame of claim 3 wherein the ventilation portion has opening parts and the total area of the opening parts is a resolvable area for resolving the pressure changes between the atmospheric pressure and the vacuum.

6. The pellicle frame of claim 1, wherein the height of the recessed portion is 30% or less of the thickness of the pellicle frame.

7. A pellicle frame having two end faces and two side faces in a frame shape, having a plurality of recessed portions provided so that the recessed portions extend from one of said two end faces toward another of said two end faces, wherein the plurality of recessed portions include one recessed portion which extends from one of said two side faces toward another of said two side faces and does not penetrate from said one of the two side faces to said another said of the two side faces, and another recessed portion which extends from one of said two side faces to another of said two side faces so that said another recessed portion penetrates from said one of the two side faces to said another of the two side faces, and
wherein the height of the recessed portion is 30% or less of the thickness of the pellicle frame.

8. The pellicle frame of claim 7, wherein the thickness of the pellicle frame is from 1.0 to 1.6 mm.

9. The pellicle frame of claim 7, wherein the recessed portion is an element of a ventilation portion.

10. The pellicle frame of claim 9 wherein the ventilation portion has opening parts and the total area of the opening parts is an area applicable to EUV lithography.

11. The pellicle frame of claim 9, wherein the ventilation portion has opening parts and the total area of the opening parts is a resolvable area for resolving the pressure changes between the atmospheric pressure and the vacuum.

12. A pellicle, comprising:
the pellicle frame of claim 1 as an element.

13. A pellicle, comprising:
the pellicle frame of claim 7 as an element.

14. An exposure method, wherein the exposure is performed by using the pellicle of claim 12.

15. An exposure method, wherein EUV exposure is performed by using the pellicle of claim 12.

16. An exposure method, wherein the exposure is performed by using the pellicle of claim 13.

17. An exposure method, wherein EUV exposure is performed by using the pellicle of claim 13.

18. A manufacturing method of a semiconductor device, comprising a step of forming a pattern by irradiating a semiconductor wafer with an exposure, wherein the exposure is performed by using the pellicle of claim 12.

19. A manufacturing method of a semiconductor device, comprising a step of forming a pattern by irradiating a semiconductor wafer with EUV exposure, wherein the EUV exposure is performed by using the pellicle of claim 12.

20. A manufacturing method of a semiconductor device, comprising a step of forming a pattern by irradiating a semiconductor wafer with an exposure, wherein the exposure is performed by using the pellicle of claim 13.

21. A manufacturing method of a semiconductor device, comprising a step of forming a pattern by irradiating a semiconductor wafer with EUV exposure, wherein the EUV exposure is performed by using the pellicle of claim 13.

* * * * *